United States Patent
Ni et al.

(10) Patent No.: US 12,388,459 B2
(45) Date of Patent: Aug. 12, 2025

(54) CIRCUITS, CHIPS, SYSTEMS AND METHODS FOR ELIMINATING RANDOM PERTURBATION

(71) Applicant: Chongqing GigaChip Technology Co., Ltd., Chongqing (CN)

(72) Inventors: Yabo Ni, Chongqing (CN); Yong Zhang, Chongqing (CN); Xiaofeng Shen, Chongqing (CN); Ting Li, Chongqing (CN); Lu Liu, Chongqing (CN); Can Zhu, Chongqing (CN); Jiahao Peng, Chongqing (CN); Liang Li, Chongqing (CN); Dongbing Fu, Chongqing (CN); Jianan Wang, Chongqing (CN)

(73) Assignee: Chongqing GigaChip Technology Co., Ltd., Chongqing (CN)

(*) Notice: Subject to any disclaimer, the term of this patent is extended or adjusted under 35 U.S.C. 154(b) by 162 days.

(21) Appl. No.: 18/527,355

(22) Filed: Dec. 3, 2023

(65) Prior Publication Data
US 2024/0120932 A1    Apr. 11, 2024

Related U.S. Application Data

(63) Continuation of application No. PCT/CN2021/118892, filed on Sep. 17, 2021.

(30) Foreign Application Priority Data

Aug. 10, 2021 (CN) .................. 202110914261.4

(51) Int. Cl.
*H03M 1/16* (2006.01)
*H03M 1/10* (2006.01)
*H03M 1/38* (2006.01)

(52) U.S. Cl.
CPC .......... *H03M 1/164* (2013.01); *H03M 1/1038* (2013.01); *H03M 1/38* (2013.01)

(58) Field of Classification Search
CPC ...... H03M 1/164; H03M 1/1038; H03M 1/38; H03M 1/12; H03M 1/0612; H03M 1/0639; H03M 1/0656
See application file for complete search history.

(56) References Cited

U.S. PATENT DOCUMENTS 11,171,662 B1 * 11/2021 Steensgaard-Madsen .................. H03M 1/468
2024/0120932 A1 * 4/2024 Ni ....................... H03M 1/0612

FOREIGN PATENT DOCUMENTS

CN    108988860 A    12/2018

* cited by examiner

*Primary Examiner* — Omeed Alizada (57) ABSTRACT

Embodiments of the disclosure provide a circuit, chip, system, and method for eliminating random perturbation. The circuit includes a weight calculating module for receiving digital signals and random perturbation digital quantity, using least mean square error algorithm to calculate weight deviation iteration coefficient based on digital signal and digital quantity, and updating perturbation weight in real-time according to weight deviation iteration coefficient; and a perturbation eliminating module for eliminating perturbation signal in output digital signal of quantizer according to perturbation weight updated in real-time and updating perturbation weight in real-time according to weight deviation iteration coefficient, and then calculating current perturbation weight in real time to realize self-calibration of perturbation weight. Even if the manufacturing process or working environment of the current chip changes, perturbation weight can be dynamically adjusted, to ideally eliminate perturbation signal in digital signal.

13 Claims, 3 Drawing Sheets

CIRCUITS, CHIPS, SYSTEMS AND METHODS FOR ELIMINATING RANDOM PERTURBATION

CROSS REFERENCE TO RELATED APPLICATION

The present disclosure is a continuation application of International Patent Application No. PCT/CN2021/118892, filed on Sep. 17, 2021, and claiming the priority to Chinese Application No. 202110914261.4 filed on Aug. 10, 2021, the contents of all of which are incorporated herein by reference in their entirety.

TECHNICAL FIELD

Embodiments of the present disclosure belong to the field of analog-digital hybrid integrated circuits, and also relate to the field of data converters, in particular to circuits, chips, systems, and methods for eliminating random perturbation.

BACKGROUND

With the continuous improvement of the performance of analog-to-digital converters (ADCs), random perturbation techniques are widely used in analog-to-digital converters. However, it is difficult to estimate the weight accurately in the existing method for perturbation weight estimation, which leads to the residual random perturbation weight in the output signal of the ADC, resulting in a decrease in the signal-to-noise ratio (SNR) of the ADCs. In addition, due to the problem with the consistency of the semiconductor process, there is a deviation in the perturbation weight generation circuit of each analog-to-digital converter, which leads to an increase in the workload of subsequent weight estimation. Under different temperature and voltage conditions, even for the same analog-to-digital converter chip, the random weights will be biased, leading to a degradation in the performance of the analog-to-digital converter.

Therefore, in the actual production and testing process, the estimation of the perturbation weight will result in a lot of testing and trimming costs. In addition, as the process, voltage, and temperature change, the accuracy of the estimated weight value will also be greatly reduced.

SUMMARY

In view of the above-mentioned facts of the conventional technique, embodiments of the present disclosure provide a circuit, chip, system, and method for eliminating random perturbation, which may be used for solving the problem of poor effect in the elimination of random perturbation in the conventional technique.

The first aspect of embodiments of the present disclosure provides a circuit for eliminating random perturbation, which includes: a weight calculating module and a perturbation eliminating module.

In some implementations of the first aspect, the weight calculating module has a first input terminal connected to an output terminal of a quantizer and a second input terminal connected to an output terminal of a random perturbation generating module. The weight calculating module is configured to: receive a digital signal from the quantizer and a digital quantity of a random perturbation signal from the random perturbation generating module, calculate a weight deviation iteration coefficient by using a least mean square error algorithm based on the digital signal and the digital quantity of the random perturbation signal, and update a perturbation weight in real time according to the weight deviation iteration coefficient.

In some implementations of the first aspect, the perturbation eliminating module has a first input terminal connected to the output terminal of the quantizer and a second input end connected to an output terminal of the weight calculating module. The perturbation eliminating module is configured to eliminate a perturbation signal in the digital signal output by the quantizer according to the perturbation weight updated in real-time.

In some implementations of the first aspect, the random perturbation generating module includes a PN code generating unit and a perturbation quantity generating unit, the PN code generating unit is configured to generate a random code digital quantity PN(i), the perturbation quantity generating unit is connected to an output terminal of the PN code generating unit, and the perturbation quantity generating unit is configured to generate an analog signal $PN(i) \times W_{real}$ with a perturbation signal according to the random code digital quantity PN(i).

In some implementations of the first aspect, the weight calculating module calculates the weight deviation iteration coefficient using a digital background calibration method based on a least mean square error algorithm according to the following expressions:

$$j(i+1) = j(i) - \mu \times PN(i) \times (D(V_R(i)) - PN(i) \times j(i) \times W_{design}) \quad (1)$$

$$W_{d\_real}j)i) \times W_{design_H} \quad (2)$$

$$V_R(i) = S(i) + PN(i) \times W_{real} \quad (3)$$

wherein expression (1), expression (2), and expression (3), j is an iteration coefficient, j(i) is a weight deviation iteration coefficient obtained in the i-th iteration, PN(i) is an output of a PN code generating unit, µ is a step size factor, $V_R(i)$ is an input of the quantizer, $D(V_R(i))$ is an output signal of the quantizer, $W_{design}$ is a design value of a perturbation weight, $W_{real}$ is an analog quantity of a perturbation weight, S(i) is an analog input signal, and $W_{d\_real}$ is a perturbation weight updated in real-time.

In some implementations of the first aspect, when convergence of the least mean square error algorithm is detected: an updated perturbation weight of a current random perturbation is calculated according to the weight deviation iteration coefficient obtained in a current i-th iteration, so as to obtain a digital signal with perturbation eliminated, wherein the digital signal with perturbation eliminated is $D(V_{out}(i)) \cong D(V_R(i)) - PN(i) \times j(i) \times W_{design}$, and the updated perturbation weight of the current random perturbation is $W_{d\_real} = j(i) \times W_{design} \cong D(W_{real})$.

In some implementations of the first aspect, when determining that different manufacturing processes are applied to different batches of chips or that a working environment of a chip changes: even if an analog quantity of the perturbation weight $W_{real}$ changes, the weight deviation iteration coefficient can be calculated by using the least mean square error algorithm and the perturbation weight of a current environment can be updated in real time according to the weight deviation iteration coefficient, as long as a design value of the perturbation weight $W_{design}$ is known.

In some implementations of the first aspect, the perturbation eliminating module further includes a perturbation weight storage unit connected to the output terminal of the weight calculating module, wherein the perturbation weight storage unit is configured to store the perturbation weight calculated in a digital background.

The second aspect of embodiments of the present disclosure provides a chip that includes the circuit for eliminating random perturbation as described in any one of the first aspect.

The third aspect of embodiments of the present disclosure provides a system for eliminating random perturbation. The system includes an input source, a random perturbation generating module, a quantizer, a weight calculating module, and a perturbation eliminating module.

In some implementations of the third aspect, the input source is configured to provide an input signal.

In some implementations of the third aspect, the random perturbation generating module is superposed on the input source and configured to inject a perturbation signal into the input signal.

In some implementations of the third aspect, the quantizer is configured to convert the input signal with the perturbation signal into a digital signal.

In some implementations of the third aspect, the weight calculating module has a first input end connected to an output end of a quantizer and a second input end connected to an output end of a random perturbation generating module, where the weight calculating module is configured to: receive a digital signal from the quantizer and a digital quantity of a random perturbation signal from the random perturbation generating module, calculate a weight deviation iteration coefficient by using a least mean square error algorithm based on the digital signal and the digital quantity of the random perturbation signal, and update a perturbation weight in real-time according to the weight deviation iteration coefficient.

In some implementations of the third aspect, the perturbation eliminating module has a first input end connected to the output end of the quantizer and a second input end connected to an output end of the weight calculating module, where the perturbation eliminating module is configured to eliminate a perturbation signal in the digital signal output by the quantizer according to the perturbation weight updated in real time.

The fourth aspect of embodiments of the present disclosure provides a method for eliminating random perturbation. The method includes the following operations: obtaining a digital quantity corresponding to a random perturbation signal currently injected into an input signal, and a converted digital signal of the input signal with perturbation signal; calculating a weight deviation iteration coefficient by using a least mean square error algorithm according to the digital quantity of the random perturbation signal and the digital signal; updating the perturbation weight in real-time according to the calculated weight deviation iteration coefficient; and eliminating the perturbation signal in the digital signal according to the perturbation weight updated in real-time.

In view of the above, the circuit, chip, system, and method for eliminating random perturbation according to embodiments of the present disclosure may have the following beneficial effects.

Embodiments of the present disclosure provide the weight calculating module in the circuit for eliminating random perturbation, uses the least mean square error algorithm to calculate the weight deviation iteration coefficient based on the digital signal and the random perturbation, updates the perturbation weight in real-time according to the weight deviation iteration coefficient, then calculates the current perturbation weight in real-time, and realizes the self-calibration function of the perturbation weight. Even if the manufacturing process or working environment of the current chip changes, the perturbation weight can be dynamically adjusted to ideally eliminate the perturbation signal in the digital signal. It also reduces the test cost of random perturbation weights, resulting in huge economic benefits.

DESCRIPTION OF EMBODIMENTS

Embodiments of the present disclosure are described below through specific examples, and those skilled in the art may easily understand other advantages and effects of the present disclosure from the content disclosed in this specification. Embodiments of the present disclosure may also be implemented or applied through other different specific implementation modes, and various modifications or changes may be made to the details in this specification based on different viewpoints and applications without departing from the present disclosure. It should be noted that, in the case of no conflict, the following embodiments and features in the embodiments may be combined with each other.

It should be noted that the diagrams provided in the following embodiments are only to schematically illustrate the basic idea of the application, and only the components related to the application are shown in the diagrams which may not be drawn according to the number, shape and dimension in actual implementation. The type, quantity, and proportion of each component may be changed arbitrarily during actual implementation, and the component layout type may also be more complicated.

Figure 1:
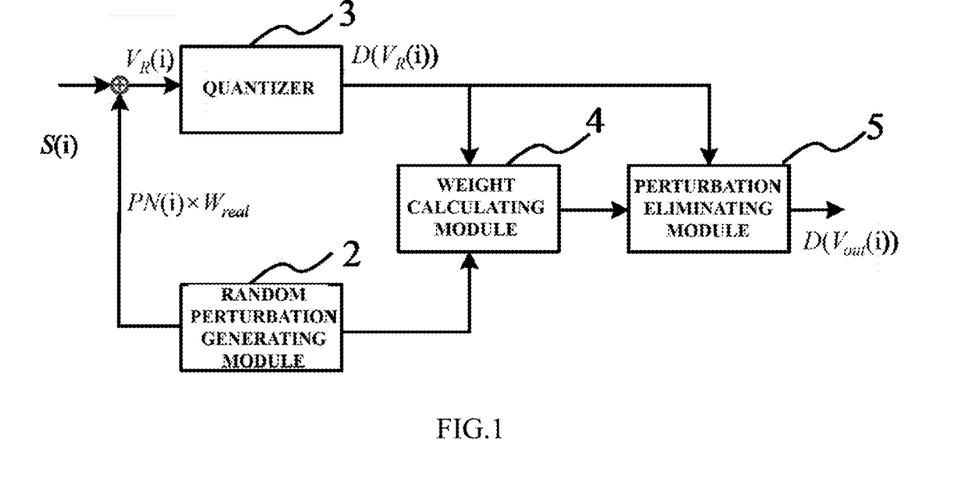
FIG. 1 shows a schematic structural diagram of a circuit for eliminating random perturbation according to exemplary embodiments of the present disclosure.

Please refer to FIG. 1, which is a schematic structural diagram of a circuit for eliminating random perturbation according to exemplary embodiments of the present disclosure. The circuit includes a weight calculating module 4, and a perturbation eliminating module 5.

In some exemplary embodiments, the weight calculating module 4 has a first input end connected to an output end of a quantizer 2 and a second input end connected to an output end of a random perturbation generating module 3. In some exemplary embodiments, the weight calculating module 4 is configured to receive a digital signal from the quantizer and a random perturbation digital quantity (or digital signal) from the random perturbation generating module, calculate a weight deviation iteration coefficient by using a least mean square error algorithm based on the digital signal and the random perturbation digital quantity, and update a perturbation weight in real-time according to the weight deviation iteration coefficient.

In some exemplary embodiments, the perturbation eliminating module 5 has a first input end connected to the output end of the quantizer 3 and a second input end connected to an output end of the weight calculating module 4. In some exemplary embodiments, the perturbation eliminating module 5 is configured to eliminate a perturbation signal in a digital signal output by the quantizer according to an updated perturbation weight.

In some exemplary embodiments, compared with the conventional method for eliminating random perturbation, embodiments of the present disclosure do not belong to conventional foreground perturbation weight estimation but are based on a digital background calibration method, which can update the perturbation weight in real-time and solves the problems of inaccuracy, heavy workload, and changing according to temperature and voltage that happen in the measurement of foreground perturbation weight estimation, resulting in significant improvement of the performance of the analog-to-digital converter and reduction in the cost of testing and adjustment.

It should be noted that the weight calculating module calculates the weight deviation iteration coefficient using the digital background calibration method based on the least mean square error algorithm according to the following expressions:

$$j(i+1)=j(i)-\mu \times PN(i) \times (D(V_R(i))-PN(i) \times j(i) \times W_{design}); \quad (1)$$

$$W_{d\_real})i) \times W_{design}; \quad (2)$$

$$V_R(i)=S(i)+PN(i) \times W_{real}, \quad (3)$$

where in expression (1), expression (2), and expression (3), j is an iteration coefficient, $j(i)$ is a weight deviation iteration coefficient obtained in the i-th iteration, PN(i) is an output of a PN code generating unit, $\mu$ is a step size factor, $V_R(i)$ is an input of the quantizer, $D(V_R(i))$ is an output signal of the quantizer, $W_{design}$ is a design value of a perturbation weight, $W_{real}$ is an analog quantity of the perturbation weight, $S(i)$ is an analog input signal, and $W_{d\_real}$ is an updated perturbation weight.

The LMS (least mean square error) algorithm has the characteristics of simple calculation, good convergence in a stable signal environment, its corresponding expected value being able to accurately converge to the Wiener solution, and the stability of the algorithm when using finite precision, and so on. These characteristics make the LMS algorithm have the best stability among self-adaptive algorithms.

In some exemplary embodiments, the LMS algorithm does not need to reuse data and does not need to perform calculations on the correlation matrix and cross-correlation matrix. It only needs to use an input vector and an expected response in each iteration. Therefore, the LMS algorithm has a simple structure and is easy to implement.

In some exemplary embodiments, the random perturbation generating module includes a PN code generating unit (also called as PN code generating circuit 21) and a perturbation quantity generating unit (also called as perturbation quantity generating circuit 22). The PN code generating unit is configured to generate a random code digital quantity PN(i). The perturbation quantity generating unit is connected to an output end of the PN code generating unit and is configured to generate an analog signal PN(i)×$W_{real}$ with a perturbation signal according to the random code digital quantity PN(i). In other words, the random perturbation generating module generates a random perturbation signal. On the one hand, the random perturbation analog signal is injected (e.g., added) to the input signal S(i) so that the input signal becomes $V_R(i)$ when input to the quantizer. On the other hand, the digital quantity of the random perturbation signal is sent to the weight calculating module so that the weight calculating module can know the current random perturbation signal or random code. As a result, the perturbation weight can be accurately obtained in the weight calculation.

In some exemplary embodiments, the random perturbation generating module generates a random level SV[1:1+$\Delta$N] of 1+$\Delta$N bit, where the value of SV[1] is '0' or '1', and only 1 bit in $\Delta$N bit of SV[2:1+$\Delta$N] is 1, and the rest of bits are 0; an analog signal with a perturbation signal is generated according to the random level SV.

It should also be noted that, when the convergence of the least mean square algorithm is detected, a perturbation weight of the current random perturbation after the perturbation weight is updated is calculated according to the weight deviation iteration coefficient obtained in the current i-th iteration, so as to obtain a digital signal after the perturbation is eliminated is $D(V_{out}(i)) \cong D(V_R(i))-PN(i) \times j(i) \times W_{design}$, where the digital signal after the perturbation is eliminated is, and the updated perturbation weight of the random perturbation is $W_{d\_real}=j(i) \times W_{design} \cong D(W_{real})$.

Here, the weight calculating module according to exemplary embodiments of the present disclosure can detect the digital signal and the injected random perturbation in real time. It can also iteratively calculate the weight deviation iteration coefficient in real time until the iteratively updated perturbation weight converges to the injected random perturbation. On the one hand, the self-calibration function of the perturbation weight is realized. On the other hand, the calculation accuracy of the random perturbation weight is greatly improved.

In some exemplary embodiments, when different manufacturing processes are applied to different batches of chips or when the working environment of the chip changes, even if the analog quantity of the perturbation weight $W_{real}$ changes, the weight deviation iteration coefficient can be calculated by using the least mean square error algorithm and the perturbation weight of the current environment can be updated in real-time according to the weight deviation iteration coefficient, as long as the design value of the perturbation weight $W_{design}$ is known.

In some exemplary embodiments, the manufacturing process, such as various chip manufacturing processes, involves the manufacture of the same type of product (chip). Due to slight changes in process conditions, or changes in the working environment of the chip, such as pressure, voltage, temperature, and other parameters, deviations in the random weights will be caused, resulting in a decrease in the performance of the chip. The chip may be an analog-to-digital converter or a digital-to-analog converter or other devices.

It should be noted that due to the detection of the influence of the above external factors, by calculating the weight deviation iteration coefficient using the least mean square error algorithm in the weight calculating module, the perturbation weight under the current conditions can be updated in real-time. Compared with the perturbation weight calculated in the foreground, the accuracy of random perturbation weights may be greatly improved.

In some exemplary embodiments, the perturbation eliminating module further includes a perturbation weight storage unit 51, which is connected to an output end of the weight calculating module. The perturbation weight storage unit is configured to store the perturbation weight calculated by a digital background. For example, the perturbation weight storage unit is a register configured to store the perturbation weight calculated in real time, which can be used for direct calling by the perturbation eliminating module.

Based on the description of the above circuit for eliminating random perturbation, exemplary embodiments of the present disclosure also provide a chip, which includes at least some of the circuit devices in the circuit for eliminating random perturbation of the above examples. In some exemplary embodiments, the chip contains all of the circuits for eliminating random perturbation. In some exemplary embodiments, the chip is connected to an analog-to-digital converter of a circuit to eliminate random perturbation through pins. In some exemplary embodiments, the chip is defined as a salable active device that uses semiconductor technology to package a circuit for eliminating random perturbation on a wafer. In some exemplary embodiments, the chip is defined as a salable active device that uses PCB packaging technology to package a circuit for eliminating random perturbation.

Figure 2:
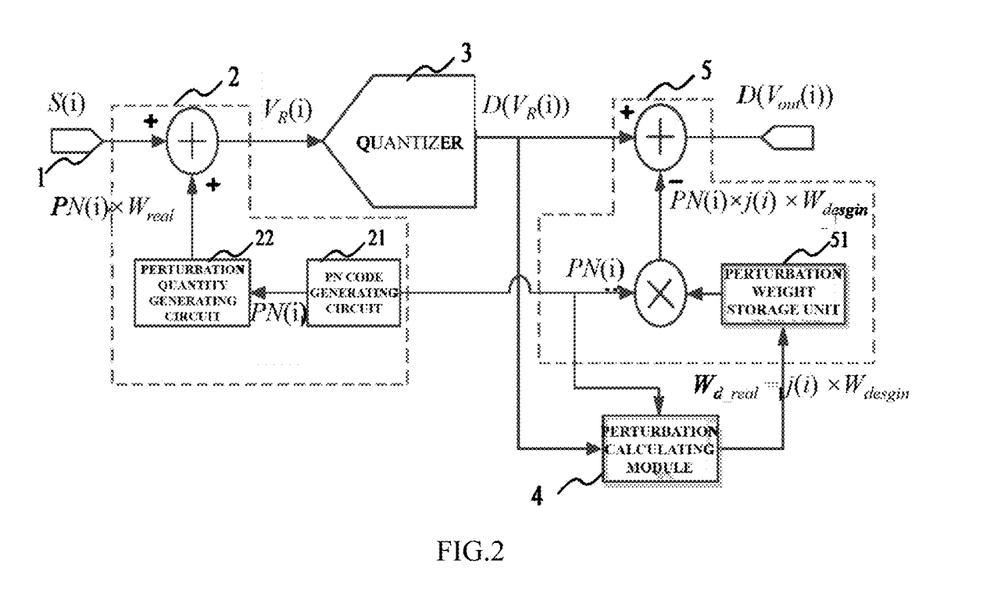
FIG. 2 shows a schematic structural diagram of a system for eliminating random perturbation according to exemplary embodiments of the present disclosure.

In some exemplary embodiments, please refer to FIG. 2, which provides a schematic structural diagram of a system for eliminating random perturbation according to exemplary embodiments of the present disclosure. The system includes an input source 1, a random perturbation generating module 2, a quantizer 3, a weight calculating module 4, and a perturbation eliminating module 5.

In some exemplary embodiments, the input source 1 is configured to provide an input signal.

In some exemplary embodiments, the random perturbation generating module 2 is superposed on the input source 1 and is configured to inject a perturbation signal into the input signal.

In some exemplary embodiments, the quantizer 3 is configured to convert the input signal with the perturbation signal into a digital signal.

In some exemplary embodiments, the weight calculating module 4 has a first input end connected to an output end of a quantizer and a second input end connected to an output end of a random perturbation generating module. In some exemplary embodiments, the weight calculating module is configured to receive a digital signal from the quantizer and a random perturbation digital quantity (or digital signal) from the random perturbation generating module, calculate a weight deviation iteration coefficient by using a least mean square error algorithm based on the digital signal and the random perturbation digital quantity, and update a perturbation weight in real-time according to the weight deviation iteration coefficient.

In some exemplary embodiments, the perturbation eliminating module 5 has a first input end connected to an output end of the quantizer and a second input end connected to an output end of the weight calculating module. In some exemplary embodiments, the perturbation eliminating module 5 is configured to eliminate a perturbation signal in a digital signal output by the quantizer according to an updated perturbation weight.

In some exemplary embodiments, on the basis of the random perturbation generating module, the quantizer, and the perturbation eliminating module, a weight calculating module including a digital background algorithm is added. The output of the digital background algorithm is the perturbation weight Wd_real updated in real-time, and the perturbation weight storage unit 51 stores the output of the digital background algorithm instead of the perturbation weight estimated by the foreground.

The expressions of the digital background algorithm are as follows:

$$j(i+1)=j(i)-\mu \times PN(i) \times (D(V_R(i))-PN(i) \times j(i) \times W_{design}); \quad (1)$$

$$W_{d\_real}j(i) \times W_{design}; \quad (2)$$

$$V_R(i)=S(i)+PN(i) \times W_{real}, \quad (3)$$

where j is an iteration coefficient, j(i) is a coefficient obtained by the i-th iteration, PN(i) is an output of a PN code generating unit, $\mu$ is a step size factor, $V_R(i)$ is an input of the quantizer, $D(V_R(i))$ is an output signal of the quantizer, $W_{design}$ is a design value of a perturbation weight, $W_{real}$ is an analog quantity of the perturbation weight, S(i) is an analog input signal, and $W_{d\_real}$ is an updated perturbation weight.

When the LMS background algorithm tends to converge, $j(i) \times W_{design} \cong D(W_{real})$, then $$j(i) = \frac{D(W_{real})}{W_{design}},$$

now the updated perturbation weight is $W_{d\_real} \cong D(W_{real})$. If $W_{d\_real}$ is removed from $D(V_R(i))$, then $D(V_{out}(i)) \cong D(V_R(i))-PN(i) \times D(W_{real})$.

When the manufacturing process and working environment such as temperature and voltage change, the actual perturbation weight changes from $W_{real}$ to $W_{real\_1}$. By applying the expression (1), when the LMS background algorithm converges again, $j(i) \times W_{design} D(W_{real\_1})$, then $$j(i) = \frac{D(W_{real\_1})}{W_{design}},$$

and $W_{d\_real} \cong D(W_{real\_1})$. Therefore, some embodiments of the present disclosure have the function of measuring the perturbation weight in real-time, so as to achieve the purpose of self-calibration of the perturbation weight.

Figure 3:
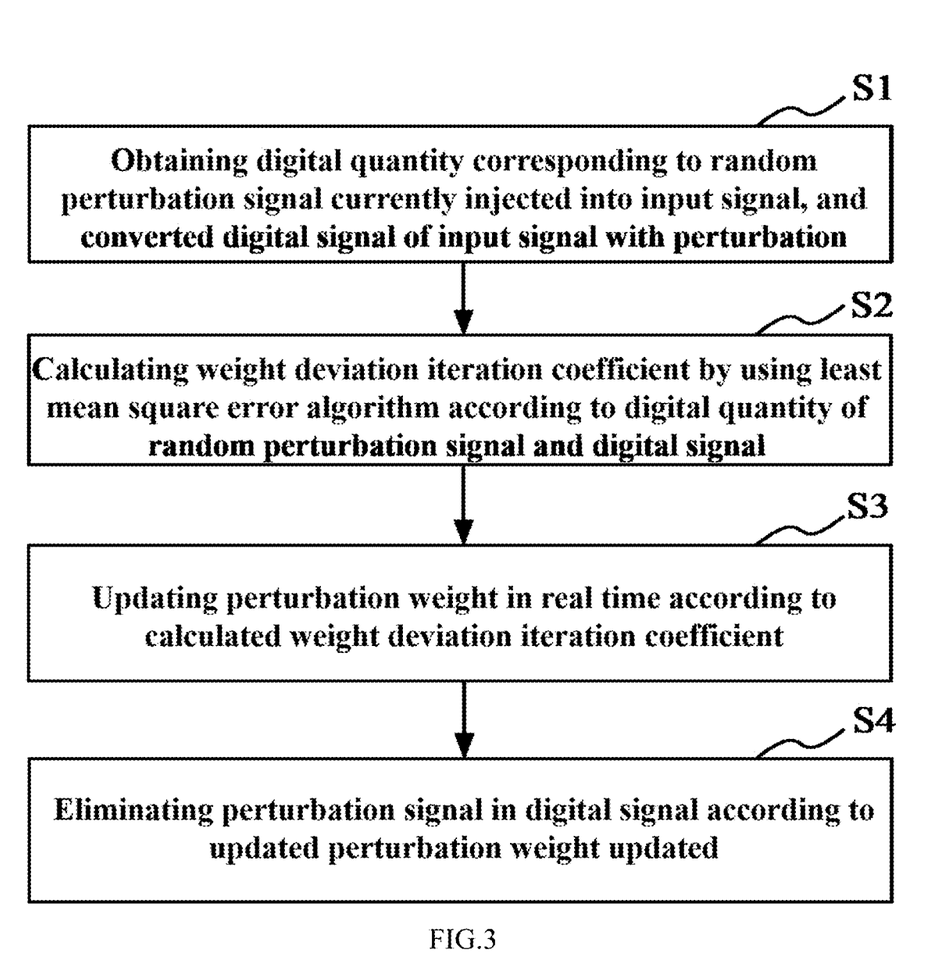
FIG. 3 shows a flowchart of a method for eliminating random perturbation according to exemplary embodiments of the present disclosure.

Please refer to FIG. 3, some embodiments of the present disclosure provide a flow chart of a method for eliminating random perturbation. The method includes operations S1 to S4.

S1, obtaining a digital quantity corresponding to a random perturbation signal currently injected into an input signal and a quantized digital signal of the input signal with perturbation.

In some exemplary embodiments, the analog quantity of the perturbation signal is injected into the input analog signal, and the analog signal with the perturbation signal is converted into a digital signal with the perturbation signal through the quantizer. This operation can be performed by the random perturbation generating module, which will not be repeated here.

S2, using a least mean square error algorithm to calculate a weight deviation iteration coefficient according to a digital quantity of the random perturbation signal and the digital signal.

In some exemplary embodiments, based on the digital signal and the random perturbation digital quantity, the weight deviation iteration coefficient is calculated using the least mean square error algorithm, see the above expression (1) for details.

S3, updating the perturbation weight in real-time according to the calculated weight deviation iteration coefficient.

Here, this operation can be performed by the weight calculating module, which will not be repeated here.

S4, eliminating the perturbation signal in the digital signal according to the updated perturbation weight.

Here, this operation can be performed by the perturbation eliminating module, which will not be repeated here.

In some exemplary embodiments, it is used to eliminate the perturbation signal in the digital signal output by the analog-to-digital converter. In some exemplary embodiments, the method for eliminating random perturbation can be implemented by the circuit for eliminating random perturbation mentioned above, or any other circuit for eliminating random perturbation that can implement the method for eliminating random perturbation.

Figure 4:
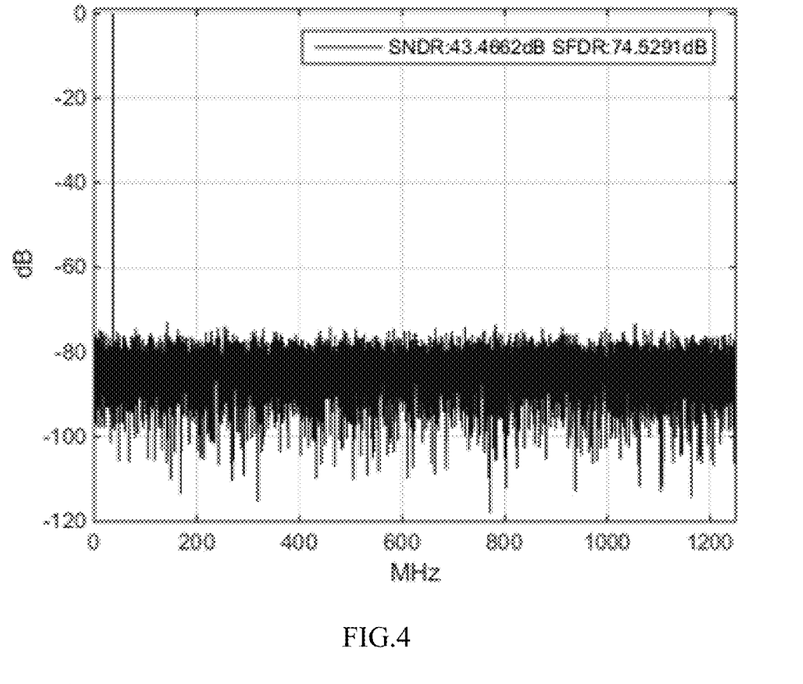
FIG. 4 shows a spectrum diagram of removing random perturbation by using a design value of random perturbation weight used in a related art.
Figure 5:
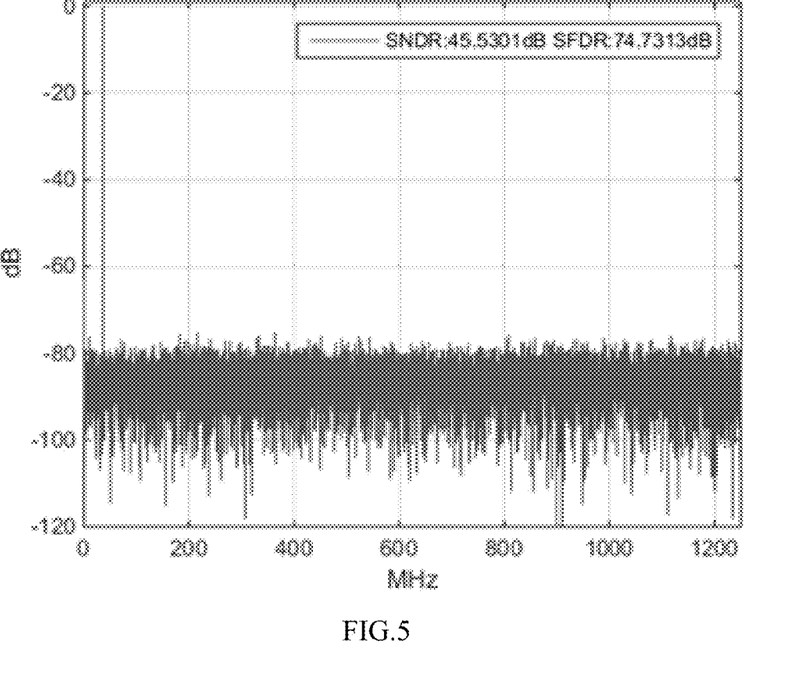
FIG. 5 shows a spectrum diagram of removing random perturbations in perturbation weights using a method for eliminating random perturbation according to exemplary embodiments of the present disclosure.

In some exemplary embodiments, please refer to FIG. 4, which is a spectrum diagram for eliminating random perturbations using the design value of random perturbation weights in the related art. Please refer to FIG. 5 a spectrum diagram of removing random perturbations in perturbation weights using a method for eliminating random perturbation according to exemplary embodiments of the present disclosure. Two different methods for eliminating random perturbations for the same chip are compared here. For example, the random perturbation can be completely removed from the output in the 8-bit Pipiline pipeline ADC analog-to-digital converter, where a design value of the random perturbation weight is used in the conventional technique to eliminate the random perturbation, and the obtained signal-to-noise ratio is 43.49 dB, while by using the method for eliminating random perturbation according to exemplary embodiments of the present disclosure to eliminate the random perturbation in the spectrum of the perturbation weight, the obtained signal-to-noise ratio is 45.53 dB. With the method according to exemplary embodiments of the present application, the signal-to-noise ratio is significantly improved, the elimination of the perturbation signal in the digital signal is realized, and the interference of the external perturbation signal is effectively avoided.

Compared with the conventional background calibration method, the present disclosure has no complicated computing unit, the circuit implementation is simpler, the effect is more stable, and the implementation complexity is low. Compared with the conventional foreground calibration method, in embodiments of the present disclosure, the random perturbation is added to the input signal, and the influence of error fluctuations with changes in the working environment can be eliminated. For example, the weight deviation iteration coefficient is calculated using the least mean square error algorithm, and the perturbation weight is updated in real-time according to the weight deviation iteration coefficient, and the spurious components of the random perturbation caused by the fluctuation of the working environment are whitened into the noise background, so as to achieve real-time calibration of random perturbations and improve the dynamic performance of the ADC.

In summary, embodiments of the present disclosure provide the weight calculating module in the circuit for eliminating random perturbation, use the least mean square error algorithm to calculate the weight deviation iteration coefficient based on the digital signal and the random perturbation, updates the perturbation weight in real-time according to the weight deviation iteration coefficient, then calculates the current perturbation weight in real-time, and realizes the self-calibration function of the perturbation weight. Even if the manufacturing process or working environment of the current chip changes, the perturbation weight can be dynamically adjusted to ideally eliminate the perturbation signal in the digital signal. It also reduces the test cost of random perturbation weights, resulting in huge economic benefits. Therefore, some embodiments of the present disclosure effectively overcome various shortcomings in the conventional technique and have high industrial application value.

The above-mentioned embodiments are only illustrative to illustrate the principles and effects of the present disclosure but are not intended to limit the present disclosure. Any person familiar with the technology can modify or change the above-mentioned embodiments without departing from the scope of the present disclosure. Therefore, all equivalent modifications or changes made by those skilled in the art without departing from the technical ideas disclosed in the application shall still be covered by the claims of the application.

What is claimed is:

1. A circuit for eliminating random perturbation, comprising:
   a weight calculating module, having a first input end connected to an output end of a quantizer and a second input end connected to an output end of a random perturbation generating module, wherein the weight calculating module is configured to:
      receive a digital signal from the quantizer and a digital quantity of a random perturbation signal from the random perturbation generating module,
      calculate a weight deviation iteration coefficient by using a least mean square error algorithm based on the digital signal and the digital quantity of the random perturbation signal, and
      update a perturbation weight in real-time according to the weight deviation iteration coefficient; and
   a perturbation eliminating module, having a first input end connected to the output end of the quantizer and a second input end connected to an output end of the weight calculating module, wherein the perturbation eliminating module is configured to eliminate a perturbation signal in the digital signal output by the quantizer according to the perturbation weight updated in real-time;
   wherein
   the random perturbation generating module includes a PN code generating unit and a perturbation quantity generating unit,
   the PN code generating unit is configured to generate a random code digital quantity $PN(i)$,
   the perturbation quantity generating unit is connected to an output end of the PN code generating unit, and
   the perturbation quantity generating unit is configured to generate an analog signal $PN(i) \times W_{real}$ with a perturbation signal according to the random code digital quantity $PN(i)$.

2. The circuit according to claim 1, wherein the weight calculating module calculates the weight deviation iteration coefficient using a digital background calibration method based on a least mean square error algorithm according to the following expressions:

$$j(i+1)=j(i)-\mu \times PN(i) \times (D(V_R(i))-PN(i) \times j(i) \times W_{design}); \quad (1)$$

$$W_{d\_real}j)i) \times W_{design}; \quad (2)$$

$$V_R(i)=S(i)+PN(i) \times W_{real}, \quad (3)$$

wherein in expression (1), expression (2), and expression (3), j is an iteration coefficient, $j(i)$ is a weight deviation iteration coefficient obtained in the i-th iteration, $PN(i)$ is an output of a PN code generating unit, $\mu$ is a step size factor, $V_R(i)$ is an input of the quantizer, $D(V_R(i))$ is an output signal of the quantizer, $W_{design}$ is a design value of a perturbation weight, $W_{real}$ is an analog quantity of a perturbation weight, $S(i)$ is an analog input signal, and $W_{d\_real}$ is a perturbation weight updated in real-time.

3. The circuit according to claim 2, wherein upon detection of convergence of the least mean square error algorithm: an updated perturbation weight of a current random perturbation is calculated according to the weight deviation iteration coefficient obtained in a current i-th iteration, so as to obtain a digital signal with perturbation eliminated is $D(V_{out}(i)) \cong D(V_R(i)) - PN(i) \times j(i) \times W_{design}$, wherein the digital signal with perturbation eliminated is, and the updated perturbation weight of the current random perturbation is $W_{d\_real} = j(i) \times W_{design} \cong D(W_{real})$.

4. The circuit according to claim 1, wherein upon determining that different manufacturing processes are applied to different batches of chips or that a working environment of a chip changes: even if an analog quantity of the perturbation weight $W_{real}$ changes, the weight deviation iteration coefficient is able to be calculated by using the least mean square error algorithm and the perturbation weight of a current environment is able to be updated in real-time according to the weight deviation iteration coefficient, as long as a design value of the perturbation weight $W_{design}$ is known.

5. The circuit according to claim 1, wherein the perturbation eliminating module further includes a perturbation weight storage unit connected to the output end of the weight calculating module, wherein the perturbation weight storage unit is configured to store the perturbation weight calculated in a digital background.

6. A chip comprising the circuit for eliminating random perturbation of claim 1.

7. The chip according to claim 6, wherein
the random perturbation generating module includes a PN code generating unit and a perturbation quantity generating unit,
the PN code generating unit is configured to generate a random code digital quantity $PN(i)$,
the perturbation quantity generating unit is connected to an output end of the PN code generating unit, and
the perturbation quantity generating unit is configured to generate an analog signal $PN(i) \times W_{real}$ with a perturbation signal according to the random code digital quantity $PN(i)$.

8. The chip according to claim 6, wherein the weight calculating module calculates the weight deviation iteration coefficient using a digital background calibration method based on a least mean square error algorithm according to the following expressions:

$$j(i+1) = j(i) - \mu \times PN(i) \times (D(V_R(i)) - PN(i) \times j(i) \times W_{design}); \quad (1)$$

$$W_{d\_real}j)i) \times W_{design}; \quad (2)$$

$$V_R(i) = S(i) + PN(i) \times W_{real}, \quad (3)$$

wherein in expression (1), expression (2), and expression (3), j is an iteration coefficient, $j(i)$ is a weight deviation iteration coefficient obtained in the i-th iteration, $PN(i)$ is an output of a PN code generating unit, $\mu$ is a step size factor, $V_R(i)$ is an input of the quantizer, $D(V_R(i))$ is an output signal of the quantizer, $W_{design}$ is a design value of a perturbation weight, $W_{real}$ is an analog quantity of a perturbation weight, $S(i)$ is an analog input signal, and $W_{d\_real}$ is a perturbation weight updated in real-time.

9. The chip according to claim 8, wherein upon detection of convergence of the least mean square error algorithm: an updated perturbation weight of a current random perturbation is calculated according to the weight deviation iteration coefficient obtained in a current i-th iteration, so as to obtain a digital signal with perturbation eliminated is $D(V_{out}(i)) \cong D(V_R(i)) - PN(i) \times j(i) \times W_{design}$, wherein the digital signal with perturbation eliminated is, and the updated perturbation weight of the current random perturbation is $W_{d\_real} = j(i) \times W_{design} \cong D(W_{real})$.

10. The chip according to claim 6, wherein upon determining that different manufacturing processes are applied to different batches of chips or that a working environment of a chip changes: even if an analog quantity of the perturbation weight $W_{real}$ changes, the weight deviation iteration coefficient is able to be calculated by using the least mean square error algorithm and the perturbation weight of a current environment is able to be updated in real-time according to the weight deviation iteration coefficient, as long as a design value of the perturbation weight $W_{design}$ is known.

11. The chip according to claim 6, wherein the perturbation eliminating module further includes a perturbation weight storage unit connected to the output end of the weight calculating module, wherein the perturbation weight storage unit is configured to store the perturbation weight calculated in a digital background.

12. A system for eliminating random perturbation, comprising:
an input source, configured to provide an input signal;
a random perturbation generating module, superposed on the input source and configured to inject a perturbation signal into the input signal;
a quantizer, configured to convert the input signal with the perturbation signal into a digital signal;
a weight calculating module, having a first input end connected to an output end of a quantizer and a second input end connected to an output end of a random perturbation generating module, wherein the weight calculating module is configured to:
receive a digital signal from the quantizer and a digital quantity of a random perturbation signal from the random perturbation generating module,
calculate a weight deviation iteration coefficient by using a least mean square error algorithm based on the digital signal and the digital quantity of the random perturbation signal, and
update a perturbation weight in real-time according to the weight deviation iteration coefficient; and
a perturbation eliminating module, having a first input end connected to the output end of the quantizer and a second input end connected to an output end of the weight calculating module, wherein the perturbation eliminating module is configured to eliminate a perturbation signal in the digital signal output by the quantizer according to the perturbation weight updated in real-time;
wherein
the random perturbation generating module includes a PN code generating unit and a perturbation quantity generating unit,
the PN code generating unit is configured to generate a random code digital quantity $PN(i)$,
the perturbation quantity generating unit is connected to an output end of the PN code generating unit, and
the perturbation quantity generating unit is configured to generate an analog signal $PN(i) \times W_{real}$ with a perturbation signal according to the random code digital quantity $PN(i)$.

13. A method for eliminating random perturbation, comprising:

generating a random code digital quantity PN(i) and generating an analog signal PN(i)×$W_{real}$ with a perturbation signal according to the random code digital quantity PN(i) to obtain a random perturbation signal;

obtaining a digital quantity corresponding to the random perturbation signal currently injected into an input signal, and a converted digital signal of the input signal with perturbation;

calculating a weight deviation iteration coefficient by using a least mean square error algorithm according to the digital quantity of the random perturbation signal and the digital signal;

updating the perturbation weight in real-time according to the calculated weight deviation iteration coefficient; and eliminating the perturbation signal in the digital signal according to the perturbation weight updated in real-time.

* * * * *